(12) United States Patent
White et al.

(10) Patent No.: US 10,074,449 B2
(45) Date of Patent: Sep. 11, 2018

(54) ADDITIVELY MANUFACTURED CONCRETE-BEARING RADIATION ATTENUATION STRUCTURE

(71) Applicant: Raytheon Company, Waltham, MA (US)

(72) Inventors: Ryan D. White, Tucson, AZ (US); Andrew Michael Wilds, Sahuarita, AZ (US); Jerry L. Schlabach, Vail, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/188,178

(22) Filed: Jun. 21, 2016

(65) Prior Publication Data
US 2017/0365365 A1     Dec. 21, 2017

(51) Int. Cl.
*G21F 1/04* (2006.01)
*B33Y 80/00* (2015.01)
(Continued)

(52) U.S. Cl.
CPC .............. *G21F 1/042* (2013.01); *B28B 1/001* (2013.01); *B29C 64/124* (2017.08); *B33Y 10/00* (2014.12);
(Continued)

(58) Field of Classification Search
None
See application file for complete search history.

(56) References Cited

U.S. PATENT DOCUMENTS

| 4,263,166 A | * | 4/1981 | Adams | .................. B05B 7/1209 |
| | | | | 239/113 |
| 5,402,455 A | * | 3/1995 | Angelo, II | .............. G21F 1/047 |
| | | | | 250/515.1 |

(Continued)

FOREIGN PATENT DOCUMENTS

| AT | 385 550 B | 4/1988 |
| GB | 1 034 842 A | 7/1966 |
| WO | WO 2005/070657 A1 | 8/2005 |

OTHER PUBLICATIONS

Gosselin et al. "Large-scale 3D printing of ultra-high performance concrete—a new processing route for architects and builders" Materials and Design 100 (2016).*

(Continued)

*Primary Examiner* — David E Smith
*Assistant Examiner* — James Choi
(74) *Attorney, Agent, or Firm* — Renner, Otto, Boisselle & Sklar, LLP

(57) ABSTRACT

A radiation-shielding attenuation structure and method of forming the attenuation structure, wherein the attenuation structure is made by additively manufacturing a concrete material that includes one or more attenuation dopants configured to enhance the radiation shielding of the concrete material. The one or more attenuation dopants may be configured in the concrete material to attenuate one or more types of radiation, such as electromagnetic radiation, gamma radiation, X-ray radiation, or neutron radiation. The attenuation structure formed by the concrete material may be additively manufactured on-site according to a model that has already been pre-certified for safe or secure use, thereby providing a repeatable and reproducible process that can reduce lead times and fabrication costs. The attenuation structure may be easily modified during the additive manufacturing process to have different concrete mixtures with (Continued)

different attenuation characteristics, which increases the tailorability and flexibility in design of the attenuation structure.

19 Claims, 5 Drawing Sheets

(51) Int. Cl.
| | |
|---|---|
| B33Y 10/00 | (2015.01) |
| H05K 9/00 | (2006.01) |
| B33Y 50/02 | (2015.01) |
| B33Y 70/00 | (2015.01) |
| B33Y 30/00 | (2015.01) |
| B28B 1/00 | (2006.01) |
| E04H 9/00 | (2006.01) |
| G21F 3/00 | (2006.01) |
| B29C 64/124 | (2017.01) |
| E04B 1/35 | (2006.01) |
| G21F 7/00 | (2006.01) |
| E04B 1/92 | (2006.01) |
| E04G 21/00 | (2006.01) |

(52) U.S. Cl.
CPC .............. *B33Y 30/00* (2014.12); *B33Y 70/00* (2014.12); *B33Y 80/00* (2014.12); *E04B 1/35* (2013.01); *E04H 9/00* (2013.01); *G21F 1/047* (2013.01); *G21F 3/00* (2013.01); *H05K 9/00* (2013.01); *H05K 9/0001* (2013.01); *H05K 9/0003* (2013.01); *H05K 9/0081* (2013.01); *H05K 9/0083* (2013.01); *B33Y 50/02* (2014.12); *E04B 2001/925* (2013.01); *E04G 21/00* (2013.01); *G21F 7/00* (2013.01)

(56) References Cited

U.S. PATENT DOCUMENTS

| | | | | |
|---|---|---|---|---|
| 8,968,461 | B1* | 3/2015 | Tuan | C04B 28/04 |
| | | | | 106/472 |
| 2002/0134951 | A1* | 9/2002 | Vanvor | C04B 28/02 |
| | | | | 250/515.1 |
| 2004/0004196 | A1* | 1/2004 | DeMeo | B32B 5/26 |
| | | | | 250/516.1 |
| 2004/0067328 | A1* | 4/2004 | Taniuchi | C04B 22/0013 |
| | | | | 428/34.4 |
| 2007/0105445 | A1* | 5/2007 | Manto | H05K 7/1497 |
| | | | | 439/620.09 |
| 2014/0093678 | A1* | 4/2014 | Walker | E04B 1/7069 |
| | | | | 428/106 |
| 2014/0252668 | A1* | 9/2014 | Austin | B28B 3/20 |
| | | | | 264/40.7 |
| 2015/0305211 | A1* | 10/2015 | Dhakate | C01B 31/00 |
| | | | | 252/71 |
| 2015/0357066 | A1* | 12/2015 | Singh | G21F 5/14 |
| | | | | 405/129.55 |
| 2016/0234977 | A1* | 8/2016 | Tuan | H05K 9/0003 |
| 2018/0071949 | A1* | 3/2018 | Giles | B33Y 30/00 |

OTHER PUBLICATIONS

Akkurt et al. "Radiation shielding of concretes containing different aggregates" Cement & Concrete Composites 28 (2006).*
"Giant 3D printer could build homes in under a day", RT Question More, https://www.rt.com/usa/3d-printed-concrete-house-727/, pp. 1-4, published Jan. 16, 2014.
Kraft, Caleb, "Castle 3D Printed With Concrete in Someone's Yard", Make: We are all Makers, http://makezine.com/2014/08/26/castle-3d-printed-with-concrete-in-someones-yard/, 3 pages, Aug. 26, 2014.
Wang, Lucy, "Chinese Company Assembles 10 3D-Printed Concrete Houses in a Day for Less Than $5,000 Each", inhabitat, http://inhabitat.com/chinese-company-assembles-ten-3d-printed-concrete-houses-in-one-day-for-less-than-5000-each/, 2 pages, Apr. 6, 2014.
Krause, Aaron P., "Conductive Concrete for Electromagnetic Shielding-Methods for Development and Evaluation", University of Nebraska, Lincoln, Dissertations & Student Research in Computer Electronics & Engineering, Dec. 1, 2012.
Tiano, Amanda L. et al, "Boron Nitride Nanotube: Synthesis and Applications", Nanosensors, Biosensors, and Info-Tech Sensors and Systems, Proc. of SPIE, vol. 9060, 906006, 2014.
"Conductive concrete wins Popular Science prize", National Research Council Canada, http://www.nrc-cnrc.gc.ca/ci-ic/article/v2n3-2, vol. 2, No. 3, Winer 1997.
International Search Report and Written Opinion of the International Searching Authority for Corresponding International Application PCT/US2017/014510 dated Apr. 12, 2017.

* cited by examiner

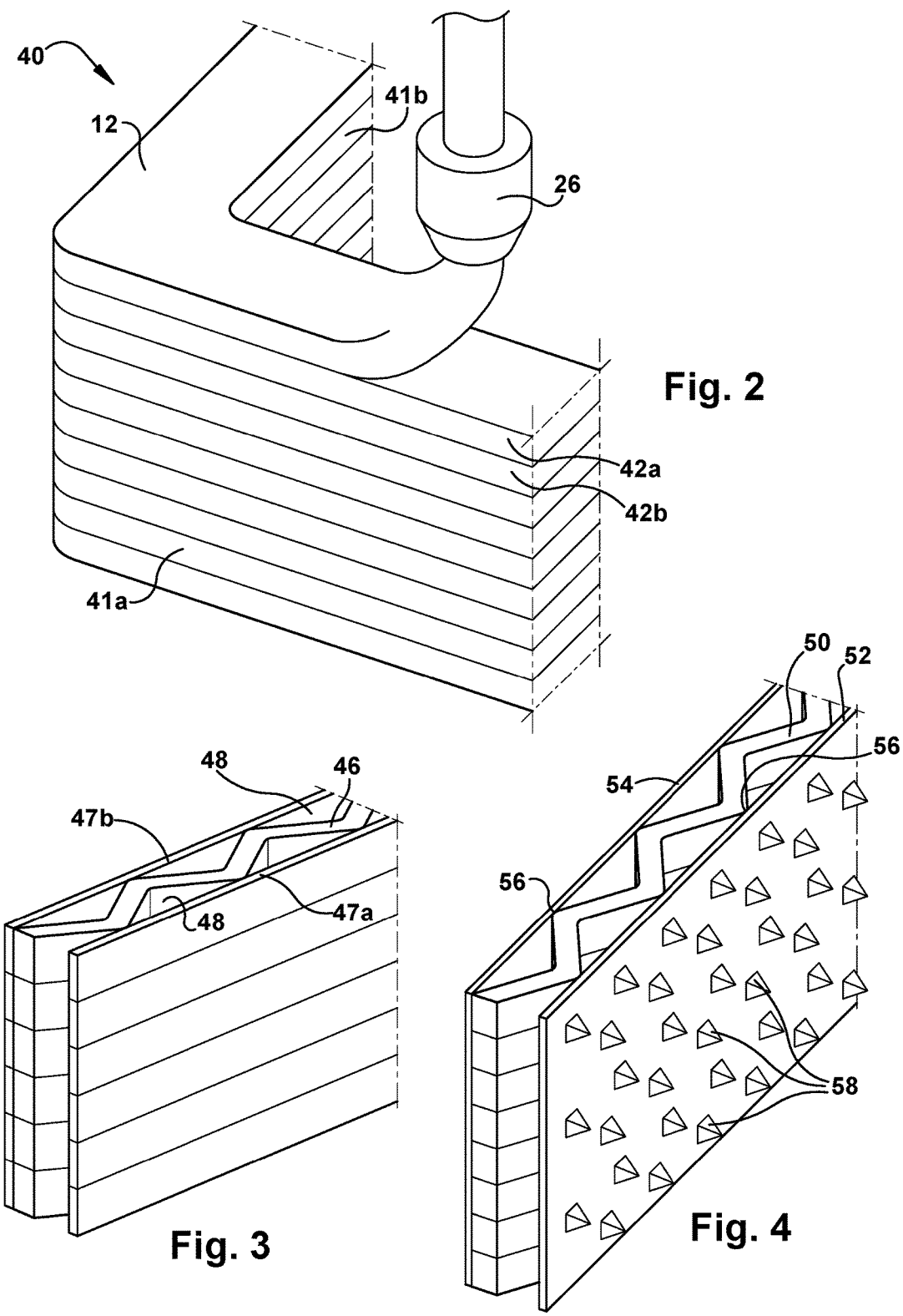

ADDITIVELY MANUFACTURED CONCRETE-BEARING RADIATION ATTENUATION STRUCTURE

FIELD OF INVENTION

The present invention relates generally to attenuation structures, and more particularly to attenuation structures made by additive manufacturing.

BACKGROUND

Attenuation structures are used to shelter objects from certain types of radiation, such as electromagnetic radiation, gamma radiation, X-ray radiation, neutron radiation, or the like. One example use of such an attenuation structure is to prevent electromagnetic radiation from interfering with the operation of electronic devices, such as computer systems or communications equipment that are contained within the structure. Typical attenuation structures focus on the use of metals and their composites, and may include the use of metal cabinets, housings, or cages that shield the objects in the structure from the radiation.

SUMMARY OF INVENTION

While known attenuation structures may be suitable for protecting objects from certain types of radiation, these structures typically have the disadvantages of limited design flexibility, difficulty of matching desired attenuation characteristics within packaging constraints, long manufacturing lead times, and increased fabrication costs. In particular, where increased safety or security is required for protecting the objects within the attenuation structure, a lengthy and expensive process for obtaining such a structure often ensues. This may include the steps of customizing the design of the attenuation structure, assembling the structure off-site, certifying that the assembled structure meets attenuation requirements, disassembling the structure, packaging and shipping the relatively large structure to the build site, and reassembling and installing the structure at the point of use.

An aspect of the present invention is to provide a radiation-shielding attenuation structure and method of forming the attenuation structure, wherein the attenuation structure is made by additively manufacturing a concrete material that includes one or more attenuation dopants configured to enhance the radiation shielding of the concrete material against one or more types of radiation. Such an attenuation structure may be built on-site according to a model that has already been pre-certified for safe or secure use. In addition, the exemplary method of forming such an attenuation structure may reduce the number of steps required by the current lengthy process, thereby improving lead times and reducing fabrication costs.

Furthermore, by additively manufacturing such attenuation structures with a concrete material that has attenuation dopant(s) dispersed therein, the tailorability and flexibility in the design of the attenuation structure may be enhanced. For example, the exemplary attenuation structure may have different types of dopants dispersed in the concrete for providing different attenuation characteristics. Such dopants may be configured to attenuate electromagnetic radiation, gamma radiation, X-ray radiation, neutron radiation, or the like. Furthermore, the concentration and/or gradient of these dopant(s) may also be varied throughout the concrete structure for enabling additional functionality and flexibility in the attenuation structure design.

The exemplary method of additively manufacturing such an attenuation structure may also enable certain structural attenuation features to be formed simultaneously during the build process to further enhance attenuation. For example, such attenuation features may include continuous wall segments devoid of seams, particularly at wall intersections. The structure may also include continuous free-formed curvatures, different cross-sectional areas, shaped features, and the like.

In addition, by additively manufacturing such attenuation structures, other types of non-concrete materials also may be simultaneously deposited with the concrete build material so as to further enhance the attenuation characteristics of the structure. For example, dielectric materials may be simultaneously deposited adjacent to the concrete material(s) as cladding, or the dielectric materials may be additively deposited within wall cavities along with the additively manufactured concrete for further improving attenuation.

According to one aspect of the invention, a method of forming a radiation-shield attenuation structure includes: (i) configuring an additive manufacturing model of the attenuation structure, and (ii) additively manufacturing the attenuation structure according to the model, wherein the additively manufacturing includes depositing a concrete material that includes an attenuation dopant configured to enhance the radiation shielding of the concrete material.

Embodiments of the invention may include one or more of the following additional features separately or in combination.

For example, the depositing the concrete material may include extrusion of a curable concrete slurry having the attenuation dopant dispersed therein.

The attenuation dopant may be heterogeneously dispersed in the concrete material being deposited.

The method may further include feeding the concrete material from a source to an extrusion nozzle, and dispersing the attenuation dopant into the concrete material downstream of the source and upstream of the extrusion nozzle.

The method may further include varying a concentration of the attenuation dopant in the concrete material during the depositing, wherein the attenuation structure has a gradient attenuation characteristic based on the varying concentration of the attenuation dopant.

The attenuation dopant may be configured to attenuate electromagnetic radiation.

For example, the attenuation dopant may be a conductive material, such as steel, carbon, taconite, and/or nickel.

The attenuation dopant may be configured to attenuate neutron radiation.

For example, the attenuation dopant may be a high neutron capture cross section material such as boron, cadmium, and/or gadolinium.

The attenuation dopant may be configured to attenuate gamma radiation or X-ray radiation.

For example, the attenuation dopant may be a high atomic number material such as lead, tungsten, and/or tantalum.

The attenuation dopant may be a first attenuation dopant, and the concrete material may include a second attenuation dopant different from the first attenuation dopant, where the first and second attenuation dopants have different attenuation characteristics.

The first attenuation and/or the second attenuation dopant may be configured to attenuate electromagnetic radiation, neutron radiation, gamma radiation or X-ray radiation.

For example, the first attenuation dopant may be a high neutron capture cross section material configured to attenuate neutron radiation, and the second attenuation dopant may be a high atomic number material configured to attenuate gamma radiation or X-ray radiation.

The concrete material may further include one or more fillers, such as density modifiers.

The step of additively manufacturing may also include depositing a non-concrete material.

For example, the non-concrete material may be a dielectric material. The dielectric material may be configured to further attenuate electromagnetic radiation.

The step of additively manufacturing may include deposition with a plurality of extrusion heads. At least one of the plurality of extrusion heads may deposit the concrete material having the attenuation dopant, where the concrete material has a first attenuation characteristic. In addition, at least one of the plurality of extrusion heads may deposit a second concrete material that includes a second attenuation dopant, where the second concrete material has a second attenuation characteristic different from the first attenuation characteristic.

The step of additively manufacturing may include deposition with a plurality of extrusion heads, where at least one of the plurality of extrusion heads deposits the concrete material having the attenuation dopant, and where at least one of the plurality of extrusion heads deposits a non-concrete material.

The step of additively manufacturing may include free forming one or more structural attenuation features configured to enhance at least one attenuation characteristic of the attenuation structure.

The step of additively manufacturing may include integrating the attenuation structure internally or externally to a preexisting structure. Alternatively, the step of additively manufacturing may include building the attenuation structure as a standalone structure.

According to another aspect of the invention, an attenuation structure includes a concrete material that encloses a space, wherein the concrete material includes an attenuation dopant configured to enhance the radiation shielding of the concrete material, and wherein the concrete material is deposited by a layerwise additive manufacturing process.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention.

FIG. 2 is a schematic perspective view of a portion of an exemplary attenuation structure formed from the exemplary additive manufacturing process.

FIG. 3 is a schematic perspective view of another portion of an exemplary attenuation structure formed from the exemplary additive manufacturing process.

FIG. 4 is a schematic perspective view of another portion of an exemplary attenuation structure formed from the exemplary additive manufacturing process.

DETAILED DESCRIPTION

The principles and aspects described herein have particular application to attenuation structures that may be used in a wide variety of military and civilian applications, ranging from electromagnetic radiation shielding of sensitive communications equipment or consumer electronics to protecting people and objects from gamma, X-ray, or neutron radiation. Although such structures may be described below chiefly in the context of governmental facilities or military bases requiring advanced safety and security, it is understood that the principles and aspects of the invention may be applicable to other industries, such as financial institutions, power plants, medical facilities, research institutions, prisons, data centers, or similar locations where it is desirable to provide a rapid, low-cost and effective structure for attenuating radiation.

Figure 1:
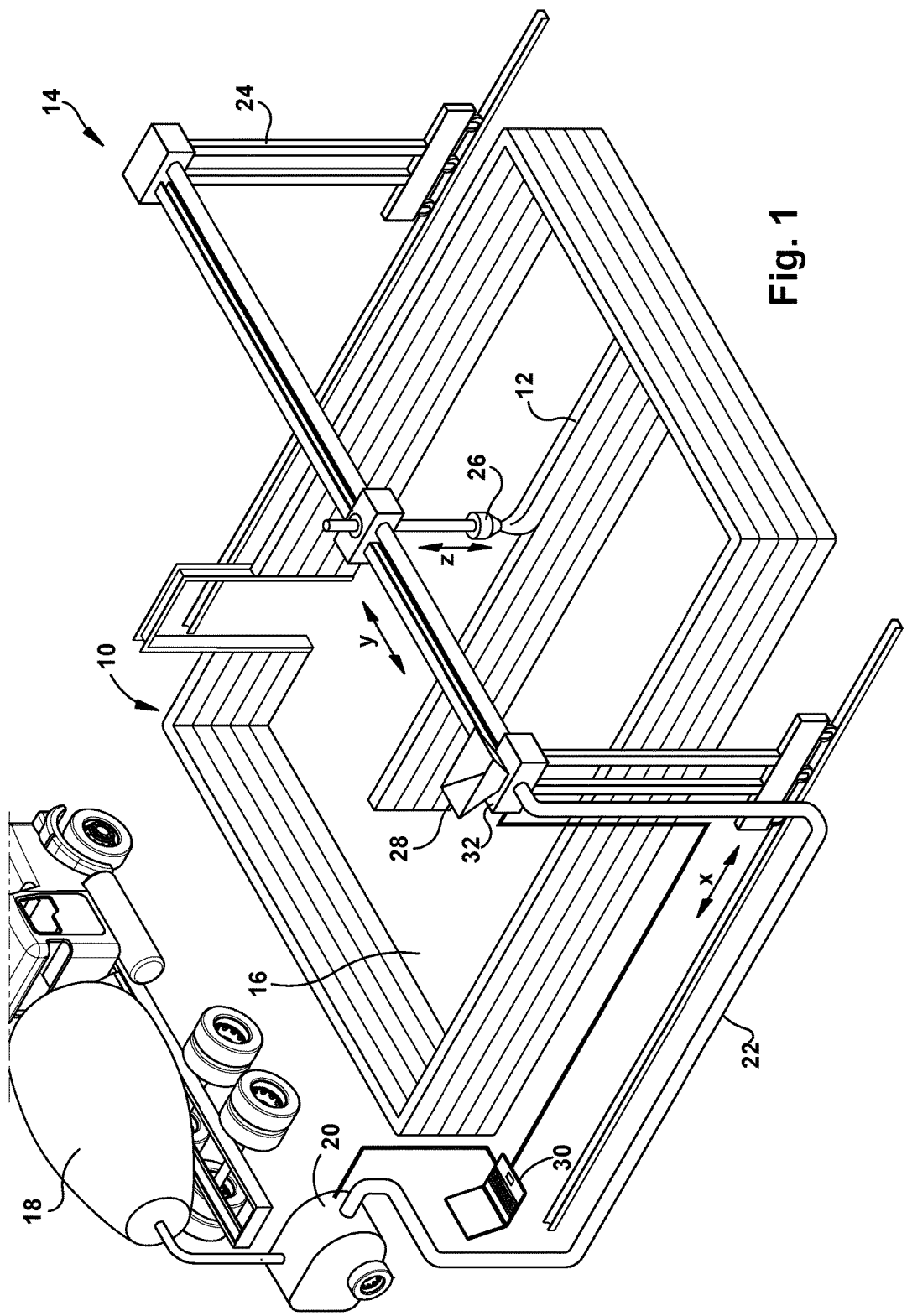
FIG. 1 is a schematic perspective view of an exemplary attenuation structure partially formed during an exemplary additive manufacturing process according to an embodiment of the invention.

Turning to FIG. 1, an exemplary radiation-shielding attenuation structure 10 is shown partially formed during an additive manufacturing process. The attenuation structure 10 is formed with a concrete material 12 that is deposited via an additive manufacturing apparatus 14 to enclose an area 16. The concrete material 12 includes at least one attenuation dopant dispersed therein which is configured to enhance the radiation shielding of the concrete material 12 to better protect objects that are contained within the attenuation structure 10.

According to the exemplary method, the attenuation structure 10 is additively manufactured according to a model, which may be defined in any suitable manner. For example, the model may be any computer-readable file or files on a non-transitory computer readable medium that collectively specify the structure, materials, etc. of the attenuation structure 10. The model may include CAD files, STL files, and the like that provide three-dimensional descriptions of the object. For example, the model may include a computer aided design and manufacturing (CAD/CAM) model having three-dimensional numeric coordinates of the entire configuration of the attenuation structure, including both external and internal surfaces, as well as any internal cavities and openings. Fabrication instructions corresponding to the model may be any collection of instructions that, when carried out by the additive manufacturing apparatus 14, result in the fabrication of the attenuation structure 10. For example, fabrication instructions may include a series of instructions for moving to various x, y, z coordinates, extruding the concrete build material, controlling feed rates, mixing speeds, etc. In addition, the model may define the concentration, type, or general configuration of the attenuation dopant dispersed in the concrete material 12 so as to attain the desired attenuation characteristics of the structure 10.

In exemplary embodiments, the model may be pre-certified by a governing body according to industry or military standards without requiring the need to pre-assemble and test the attenuation structure before its installation at the point of use. In particular, such CAD/CAM models are typically known for producing highly repeatable designs with relatively low margins of error that are near the resolution of the material deposited by the additive manufacturing apparatus. In this way, the certification of the modeled design may be given a high confidence that reproduction of that design in situ at the point of use anywhere in the world should yield the same result, and a post-construction test could verify the build. In this manner, the exemplary method of additively manufacturing such an attenuation structure moves the certification process to the design phase instead of the build phase, which may improve lead times and reduce labor, fabrication, and transportation costs.

The additive manufacturing process that is used for forming the concrete material 12 to define the attenuation structure 10 may include such methods as layerwise deposition, or other suitable additive manufacturing techniques which can be chosen based on the materials, tolerances, size, quantity, accuracy, cost structure, critical dimensions, and other parameters defined by the requirements of the attenuation structure to be made. In the illustrated embodiment, the process of additively manufacturing the attenuation structure 10 includes the use of a mixer 18, a pump 20, fluid conduits 22, and the additive manufacturing apparatus 14, which generally includes a frame 24 and an extrusion head 26 for layerwise deposition of the concrete material 12 having the attenuation dopants dispersed therein. Although the mixer 18, pump 20, and/or fluid conduits 22 are shown as separate units from the additive manufacturing apparatus 14, it is understood that these units may also be integrated into the additive manufacturing apparatus 14.

As an initial step, after the model of the attenuation structure 10 has been configured and the build site has been arranged, the concrete material 12 may first be prepared. The concrete material 12 may initially be made into a base concrete slurry that is capable of being admixed with the attenuation dopant(s) to form a curable concrete slurry mixture having suitable properties for being extruded and deposited through the additive manufacturing apparatus 14. The base concrete slurry (without the dopant dispersed therein) may include such constituents as cement (e.g., Portland cement), sand, and water. This base concrete slurry may be mixed in a suitable manner well known in the art, for example, via the mixer 18 so as to have the desired characteristics for being additively manufactured. It is understood that although the mixer 18 is shown in the form of a concrete mixing vehicle, the mixer 18 may instead be a stationary industrial mixer or the like, and the base concrete slurry may be mixed with or without the attenuation dopant(s) at an off-site location and then transported to the build site.

One or more attenuation dopants may be admixed with the base concrete slurry in the mixer 18, or the attenuation dopant(s) may be dispersed within the base concrete slurry further downstream prior to deposition. The attenuation dopants may be selected and dispersed into the concrete slurry as needed to provide the desired attenuation characteristic of the attenuation structure 10 formed from the cured concrete material 12. For example, the attenuation dopant dispersed in the concrete material 12 may be configured to attenuate electromagnetic radiation, gamma radiation, X-ray radiation, or neutron radiation, which may depend on the material type, physical form, size, amount, etc. of the attenuation dopant dispersed in the concrete material, among other considerations. The type, amount, size and form (e.g., powder, fiber, etc.) of the attenuation dopant may also be selected in a suitable manner for meshing well with the base concrete slurry so that the dopant may be homogenously distributed and suspended within the concrete slurry, and also so that the dopant may be adequately bound within the concrete material 12 along with the other concrete constituent when cured.

In some exemplary embodiments, the attenuation dopant dispersed in the concrete material is configured to attenuate electromagnetic radiation. The mechanism for attenuating electromagnetic radiation may be by reflection and/or absorption of electromagnetic waves. For example, where attenuation by reflection is desired, the attenuation dopant may include an electrically conductive material, and a suitable amount of such dopant may be dispersed in the concrete material 12 so as to increase the electrical conductivity of the concrete to a level where the electromagnetic radiation is reflected. Where attenuation by absorption is desired, the attenuation dopant may include an electrically conductive material or a magnetic material that is used in a suitable concentration in the concrete material 12 so as to enhance resonance, where a stronger resonance leads to a higher level of electromagnetic radiation attenuation. It is understood that the concrete material 12 may be configured to increase both absorption and reflection of electromagnetic radiation, as discussed in further detail below. Exemplary attenuation dopants that may be configured for attenuating electromagnetic radiation include conductive materials, such as steel (in the form of fibers, for example), carbon (in the form of powder, for example), taconite (in the form of aggregates, for example), and nickel (in the form of nanotubes, for example).

In some exemplary embodiments, the attenuation dopant dispersed in the concrete material is configured to attenuate gamma radiation or X-ray radiation. The attenuation of gamma radiation or X-ray radiation may occur through absorption and interaction of the gamma rays or X-rays with the concrete material 12 having the attenuation dopant(s) dispersed therein. The degree to which gamma radiation or X-ray radiation is attenuated may be dependent on the energy of the incident gamma radiation or X-ray radiation, the atomic number and density of the attenuation dopant, and the thickness of the concrete material 12, among other considerations. Exemplary attenuation dopants that may be configured for attenuating gamma radiation or X-ray radiation include high atomic number materials, such as lead, tungsten, tantalum, and the like, which may take the form of powders, particles, fibers, and the like.

In some exemplary embodiments, the attenuation dopant dispersed in the concrete material is configured to attenuate neutron radiation. The attenuation of neutron radiation may occur through absorption and interaction of the neutrons with the concrete material 12 having the attenuation dopant(s) dispersed therein, which may occur in a similar manner to the attenuation of gamma radiation or X-ray radiation described above. Exemplary attenuation dopants that may be configured for attenuating neutron radiation include materials with a high neutron capture cross section, such as boron, cadmium, gadolinium, and the like, which may take the form of powders, particles, fibers, and the like.

It is understood that the foregoing lists of attenuation dopants for attenuating electromagnetic radiation, gamma radiation, X-ray radiation, or neutron radiation are non-exhaustive lists of such materials, and that other attenuation dopants having characteristics for attenuating these different types of radiation may be selected in any suitable manner so as to provide the desired attenuation characteristic(s) of the attenuation structure, as understood by those with skill in the art. It is also understood that the attenuation dopants may be configured to take various forms to achieve the desired attenuation characteristics, which may include powders, particles, aggregates, fibers, nanofibers, nanoparticles, and the like. It is further understood that the concrete material 12 may be configured to achieve the desired attenuation characteristics by including one or more types of attenuation dopants and/or dispersing those dopant(s) at various concentration levels and/or at various concentration gradients and/or at various locations throughout the structure, all of which may be varied in a suitable manner as understood by those having skill in the art.

After mixing the base concrete slurry with the desired attenuation dopant(s) in the mixer 18, the concrete slurry mixture may be pumped by the pump 20 from the source (e.g., mixer 18 or other holding tank) through the fluid conduits 22 toward the additive manufacturing apparatus 14. At this point, the concrete slurry mixture should have a suitable viscosity or other rheological properties so as to be transported via the conduits 22 toward the additive manufacturing apparatus 14. The final concrete slurry mixture having the attenuation dopant(s) therein should also have a suitable viscosity or other rheological properties for extrusion through the extrusion head 26, and for taking form during deposition in the layerwise additive manufacturing process.

Figure 5:
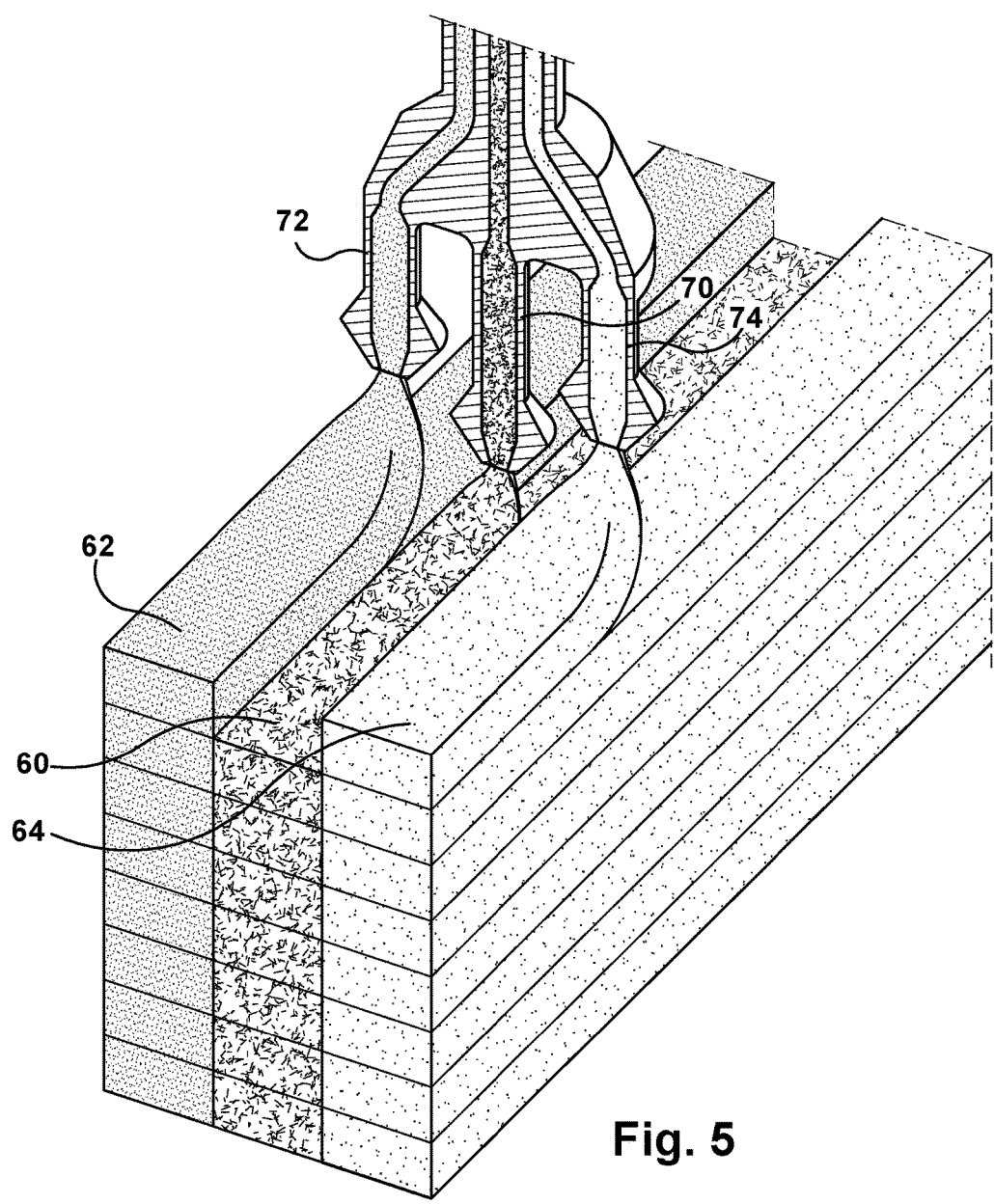
FIG. 5 is a schematic perspective view of another portion of an exemplary attenuation structure formed from the exemplary additive manufacturing process.
Figure 6:
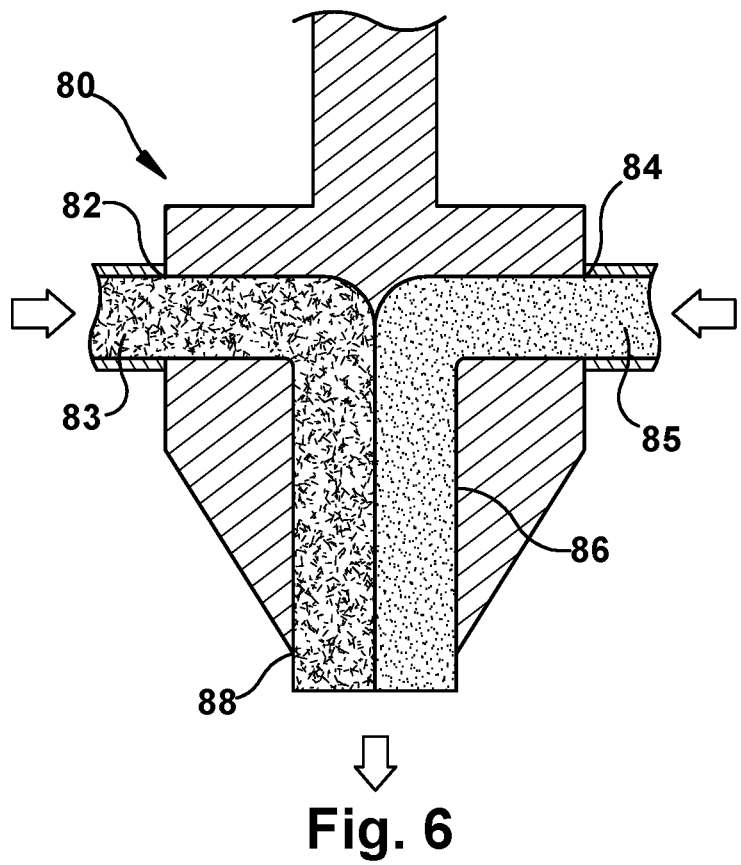
FIG. 6 is a schematic cross-sectional view of an exemplary extrusion head of an additive manufacturing apparatus depicting another exemplary method of forming the attenuation structure according to an embodiment of the invention.

In some exemplary embodiments, multiple concrete slurry mixtures having different attenuation dopants (or multiple concrete slurry mixtures having different concentrations of the same attenuation dopant) may be provided for the additive deposition process. For example, separate mixers 18 or separate holding tanks may each have a different concrete slurry mixture, and the different concrete slurry mixtures may be selectively pumped through fluid conduits 22 to the additive manufacturing extrusion head 26 for forming the attenuation structure 10. Optionally, a controller 30 may be operably connected to a valve manifold, or the like, so as to selectively control which concrete slurry mixture is to be deposited at specified locations of the attenuation structure 10. The different concrete slurry mixtures may be pumped individually through the extrusion head 26, or multiple concrete slurry mixtures may be pumped simultaneously to be coextruded through the extrusion head 26 (as shown in FIG. 6, for example). Optionally, multiple extrusion heads 26 may be provided to separately deposit the different concrete slurry mixtures (as shown in FIG. 5, for example). In this manner, the attenuation characteristics of the attenuation structure 10 can be easily varied during the additive manufacturing build process by extruding the different concrete slurry mixtures at different specified locations of the attenuation structure 10.

In other exemplary embodiments, the attenuation dopant(s) may be admixed with the base concrete slurry further downstream from the source (e.g., mixer 18 or other holding tank). For example, one type of attenuation dopant may be contained within a hopper or other feeding mechanism 28 that enables the attenuation dopant to be selectively admixed with the base concrete slurry after the base concrete slurry has been prepared but before deposition of the concrete material 12 to form the attenuation structure 10. Optionally, another mixer 32 may be provided downstream from the feeding mechanism 28 and upstream from an extrusion nozzle of the extrusion head 26 to adequately mix and distribute the attenuation dopant in the base concrete slurry to form the desired concrete slurry mixture. Various types of attenuation dopants, including different material types and/or different forms, may be provided in separate feeding mechanisms 28. A controller (e.g., controller 30) may be operably connected to the pump 20 and the one or more feeding mechanisms 28 (which may include an auger or the like) so as to control the amount or type of the one or more attenuation dopants to be dispersed in the base concrete slurry prior to deposition, thereby controlling the attenuation characteristics of the concrete material 12 that is deposited to form the attenuation structure 10. One advantage to such an exemplary configuration is that one master batch of the base concrete slurry may be used to make many different concrete slurry mixtures having dopant(s) therein. This exemplary configuration also enables the attenuation characteristics of the attenuation structure 10 to be easily varied during the additive manufacturing build process by varying and extruding the different concrete slurry mixtures at different specified locations of the attenuation structure 10.

In still another exemplary embodiment, the attenuation dopant(s) may be admixed with the base concrete slurry even further downstream from the source and closer to the point of extrusion through the nozzle of the extrusion head 26. For example, the attenuation dopant(s) may be selectively admixed with the base concrete slurry within a chamber of the extrusion head 26 that is upstream from the extrusion nozzle. The mixing within the chamber of the extrusion head 26 may occur through static and/or dynamic mixing techniques. Various types of attenuation dopants, including different material types and/or different forms, may be fed into the extrusion head 26 through one or more ports in the extrusion head 26. The various types of attenuation dopants may be fed into the chamber in raw form for mixing with the base (e.g., master) concrete material coming from the source via pump 20, for example. Alternatively or additionally, the various types of attenuation dopants may first be premixed with a base concrete material at a prescribed concentration to form a premixed concrete slurry, which may then be fed into the chamber of the extrusion head 26 for mixing with another base (e.g., master) concrete material. A controller (e.g., controller 30) may be operably connected to the pump 20 and one or more actuators for controlling the amount or type of the one or more attenuation dopants (or the amount or type of one or more premixed concrete slurries) to be dispersed in the base (e.g., master) concrete material prior to deposition, thereby controlling the attenuation characteristics of the concrete material 12 that is deposited to form the attenuation structure 10. Such an exemplary configuration for mixing attenuation dopant(s) to form a concrete slurry mixture close to the point of extrusion may reduce the working (dead) volume of the concrete slurry mixture, which may further enhance the fine tuning capabilities of adding attenuation dopant(s) into the concrete material. In other words, minimizing the dead volume of the concrete slurry mixture enables improved control over how the attenuation dopant(s) are applied in the concrete material. Such fine control of the distribution of attenuation dopant(s) in the concrete material may further enhance the ability to vary the attenuation characteristics of the concrete material, for example, providing the ability to accurately control the attenuation characteristics within a single trace of deposited concrete material (e.g., side-to-side or end-to-end of the deposited trace).

It is understood that the ability to deposit various different concrete slurry mixtures having one or more attenuation dopants (or different concentrations of the same attenuation dopants) according to the methods described above greatly enhances the design flexibility and tailorability of the attenuation structure 10.

Figure 7:
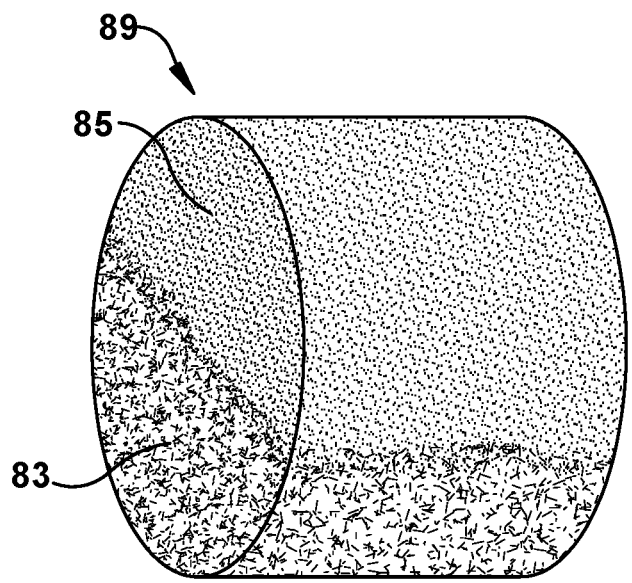
FIG. 7 is a perspective cross-sectional view showing a heterogeneous layer of material as deposited from the extrusion head of FIG. 6.

For example, in some exemplary embodiments, the concrete material 12 may be configured to increase both absorption and reflection of electromagnetic radiation. In this manner, the attenuation characteristics of the concrete material 12 may be tailored by depositing a gradient mixture or other heterogeneous mixture of concrete material (as shown in FIG. 7, for example) to decrease or increase reflectance or absorption of electromagnetic radiation at an exterior surface, an interior surface, or some intermediate transition surface of the attenuation structure 10. For example, a suitable amount electrically conductive dopants may be dispersed in the concrete material 12, either homogenously or heterogeneously, so as the increase the electrical conductivity at an external surface of the attenuation structure 10 (e.g., an outward portion of a wall of the structure 10), which may maximize the amount of electromagnetic radiation reflected outside of the attenuation structure 10 and may minimize the amount of energy entering the inside of the structure 10 through the walls of the structure 10. In addition, such a configuration that enhances reflectance of electromagnetic radiation at the exterior surface of the attenuation structure 10 also may act to increase (e.g., double) the absorptive path length of electromagnetic energy entering the walls of the structure 10 from the inside space enclosed by the structure 10. By increasing the absorptive path length in this way, the exemplary attenuation structure may act to continuously attenuate the electromagnetic energy confined inside of the attenuation structure, which may reduce resonance and prevent formation of standing waves of electromagnetic energy within the structure.

Various other configurations of the exemplary attenuation structure are possible. For example, in some embodiments, an outer wall of the attenuation structure 10 may be configured to promote attenuation of gamma radiation or X-ray radiation, while an inner wall may be configured to promote attenuation of neutron radiation. In some embodiments, some walls (e.g., sidewalls or ceilings) may have a gradient concentration of the attenuation dopant in the concrete material 12 such that the attenuation structure also has a gradient attenuation characteristic. For example, as the deposition head 26 moves to deposit the concrete slurry mixture near wall corners or other transition areas, the controller 30 may increase the concentration of attenuation dopants in the base concrete slurry (or may switch the valve manifold to a concrete slurry mixture having a higher concentration of attenuation dopants) so as to enhance the electromagnetic radiation attenuation characteristics in those transition regions. In some embodiments, some walls of the attenuation structure 10 may be configured to attenuate multiple types of radiation and different regions of those walls may have different attenuation characteristics, etc. The foregoing embodiments are but a few non-limiting examples of the various configurations of the attenuation structure 10 that are available by varying the concrete slurry mixtures during the deposition process according to the exemplary method(s) described above.

The exemplary method of additively manufacturing the attenuation structure 10 may also include the addition of other constituent materials that may be admixed with the concrete slurry mixture prior to deposition, and which may further improve the functionality of the attenuation structure 10. For example, materials having a lower density than the cured concrete material 12, such as glass spheres or the like, may be added to the concrete slurry mixture so as to create an overall lighter mixture that forms a less dense attenuation structure 10. Alternatively, materials having a higher density than the cured concrete material 12 may be added to the concrete slurry mixture so as to create an overall heavier mixture that forms a denser attenuation structure 10. These other constituent materials may be added at same time as making the base concrete slurry, or may be added before or after adding the attenuation dopant(s) as described above. Other constituent materials may also be used to enhance the concrete material, such as plasticizers, coagulants, stabilizers, thixotropic agents, corrosion inhibitors, alkali-silica reactivity inhibitors, shrinkage reducing agents, and the like, which all may be selected in a well-known manner to those having skill in the art.

After the concrete slurry mixture has been configured to have the desired configuration of attenuation dopant(s) and/or other materials for achieving the desired characteristic(s), the final concrete slurry mixture may then be extruded through the nozzle in the extrusion head 26 for layerwise additive manufacturing. The additive manufacturing apparatus 14 generally includes the frame 24, the extrusion head 26, a vertical motion drive system (Z), a lateral motion drive system (Y), and an orthogonal lateral motion drive system (X), which function in a suitable manner well-known in the art. The additive manufacturing apparatus 14 may also include one or more on- or off-axis rotational motion drive systems (e.g. pitch, yaw, roll, b-axis, etc.), which may be particularly useful for integrating the additively manufactured attenuation structure 10 with a preexisting structure. For example, layers of additively manufactured concrete may be added to preexisting structures to enhance or augment attenuation. Alternatively or additionally, preformed structural elements, such as door frames, temporary support structures, conduits, ducting, etc. may be incorporated into the exemplary attenuation structure prior to, during, or after the additive manufacturing process. In the illustrated embodiment, the extrusion head 26 is moveable relative to the frame 24 via the Z drive and the Y drive systems, and the frame 24 including extrusion head 26 are movable relative to the build area via the X drive system, which may be on rails. In exemplary embodiments, multiple extrusion heads 26 may be provided to simultaneously deposit multiple concrete slurry mixtures with the attenuation dopants, where these multiple concrete mixtures may be the same, or may be different. The additive manufacturing apparatus 14 may also include other features, such as actuators or pumps for forcing the concrete slurry mixture through the extrusion head(s) 26, positional indicators, other drive systems, controllers, and the like, which may be included and utilized according to well-known techniques for additive manufacturing.

During the extrusion and deposition process, the additive manufacturing apparatus 14 may receive fabrication instructions from a controller (e.g., controller 30) according to the previously described 3D model. The fabrication instructions may include a series of instructions for moving the extrusion head 26 and/or frame 24 to various x, y, z coordinates, or to various on- or off-axis rotational coordinates, extruding the concrete material 12 having the attenuation dopant(s) therein, controlling the feed rate of material through the extrusion head 26, etc. In this manner, the concrete slurry mixture may be deposited as a series of single layers (or traces) as the extrusion head 26 moves across the build area. In this manner, the attenuation structure 10 may be formed layer-by-layer such that each subsequent layer is integrally bound to the layer before it, and eventually defines the fully-formed attenuation structure 10. Many other configurations are possible, and the exemplary method described herein may be applicable to nearly any additive manufacturing system that is able to additively build the relatively large (i.e., larger than a person) attenuation structure 10 from the concrete material 12 having the attenuation dopant(s) therein.

In exemplary embodiments, the additive manufacturing apparatus 14 may also be configured to deposit non-concrete materials for further enhancing the attenuation characteristics of the attenuation structure 10. The non-concrete material may be extruded through the extrusion head 26 via a separate conduit, or may be extruded through a separate extrusion head. In some embodiments, the non-concrete material may be applied as a cladding to the concrete material 12, for example, as a cladding on an inner wall surface of the attenuation structure 10. In some embodiments, the non-concrete material or other surface coatings may be applied to the concrete material 12 as a spray. Alternatively or additionally, the non-concrete material may be deposited in cavities between wall structures formed from the concrete material 12. In exemplary embodiments, the additive manufacturing apparatus 14 may include multiple extrusion heads, and the non-concrete material may be deposited via one extrusion head simultaneously with the deposition of one or more concrete materials 12 via one or more additional extrusion heads 26. In some configurations, the ability to simultaneously deposit the non-concrete material adjacent to the concrete material 12 may allow the different materials to better bind together as both the non-concrete material and the concrete material 12 are cured and hardened.

In some exemplary embodiments, the non-concrete material may include a dielectric material. The dielectric material may be configured to increase the effective dielectric constant (or relative permittivity) of at least a portion of the attenuation structure 10, which may attenuate an electromagnetic wave that propagates through the dielectric material. In this manner, the dielectric material may be configured to attenuate an electromagnetic wave via absorption by increasing the loss factor (i.e., dielectric constant or κ-factor) of the dielectric material and/or by increasing the path length of the electromagnetic wave through the dielectric material. The choice of a dielectric material composition can provide effective dielectric constants that gradually increase or decrease over a range from less than 2 to about 2500. The dielectric materials can be prepared by mixing with other materials, such as thermosets, thermoplastics, or other binding media; or by including varying densities of voided regions (which generally introduce air), all of which may produce the desired dielectric constants, as well as other potentially desired media properties. For example, the dielectric material may be deposited by the exemplary additive manufacturing process to take the form of a dielectric foam having a high void content. Dielectric materials exhibiting a low dielectric constant (<2 to about 9) may be used, which may include silica and/or alumina with varying densities of voided regions. Materials exhibiting a medium dielectric constant (70 to 500) may include ferrite doped calcium titanate, and doping metals can include magnesium, strontium and niobium. For high value dielectric constants (2200 to 2650), ferrite or niobium doped calcium or barium titanate zirconates may be used.

Yet another advantage to using the exemplary additive manufacturing process described above is the ability to form the attenuation structure with additional structural features that are able to further enhance the attenuation characteristics of the overall attenuation structure. For example, referring to FIG. 2, such a structural attenuation feature is shown in the form of a continuous, free-formed structure 40 made with the concrete material 12 having attenuation dopant(s) therein according to the above described additive manufacturing process. The term "continuous" as used herein includes formation of such a structure 40 that is devoid of seams at the intersection between segments (for example, devoid of a vertical seam at the intersection between wall segments 41a, 41b, as shown in the illustrated embodiment). The term "free-formed" as used herein includes formation of such a structure 40 in its unique intended position on the build area without prefabrication or subtractive machining. By providing such continuous, free-formed structures 40, the number of seams between segments of the attenuation structure 10 may be reduced or eliminated, which thereby reduces the possibility of radiation leakage that could otherwise pass through these seams. It is noted that during the additive manufacturing process, the individual layers 42a, 42b of the deposited concrete mixture are bound together in such a way that they should not create seams or gaps that are susceptible to radiation leakage. It is also noted that such a continuous, free-formed structure 40 may be included in any portion of the exemplary attenuation structure described above for improving the structure's ability to effectively attenuate radiation. It is further understood that any such continuous, free-formed structure 40 may be integrated into an internal portion, an external portion, or an intermediate portion of a preexisting structure for enhancing the attenuation characteristics of the preexisting structure.

Referring to FIG. 3, a structural feature of an exemplary attenuation structure is shown in the form of a corrugated wall segment 46 between an inner wall segment 47a and an outer wall segment 47b. In the illustrated embodiment, each of the wall segments 46, 47a, 47b are formed by additively manufacturing concrete material according to any of the foregoing methods. The respective wall segments 46, 47a, 47b may have the same or different attenuation characteristics, and may be formed consecutively or simultaneously during the additive manufacturing process. In exemplary embodiments, the respective wall segments 46, 47a, 47b may be configured to increase the total effective attenuation properties of the attenuation structure simply by increasing the number of wall layers of the attenuation structure, without the need to modify the additive manufacturing apparatus, and with minimal design or cost impact. The corrugated wall segment 46 may provide improved structural strength while minimizing the amount of concrete material used. In addition, the corrugated wall segment 46 may provide air gaps 48 between the inner wall segment 47a and outer wall segment 47b, which may create additional internal interfaces for attenuation by reflection to occur. The air gaps 48 may also be configured to provide sufficient space for the installation of power lines, communication lines, utilities/mechanicals, HVAC, and the like for improving the usability of the attenuation structure.

Referring to FIG. 4, another feature of an exemplary attenuation structure is shown in the form of a continuous corrugated wall segment 50 disposed between a prefabricated inner wall segment 52 and a prefabricated outer wall segment 54. In the illustrated embodiment, the continuous corrugated wall segment 50 is formed by additively manufacturing concrete material according to any of the foregoing methods, and the prefabricated wall segments 52, 54 are thereafter coupled to the corrugated wall segment 50, such as by mechanical fastening, chemical adhesion, or other suitable attachment means as understood by those having skill in the art. The corrugated wall segment 50 is another example of the improved tailorability and design flexibility provided by the exemplary methods of additively manufacturing concrete material as described above. For example, the corrugated wall segment 50 may provide for both structural enhancement and attenuation characteristics of the exemplary attenuation structure, while also enabling traditional prefabricated wall structures, such as drywall or plywood, to be attached to the corrugated concrete wall segment 50. Such a configuration of the continuous corrugated wall segment 50 may also enhance attenuation of acoustics by minimizing the number of contact points 56 between the corrugated wall segment 50 and the inner wall segment 52 and/or the outer wall segment 54. The concrete wall segment 50 may further include anchor points, such as recesses or hooks, that are additively manufactured into the concrete wall segment 50 to facilitate attachment of the prefabricated wall segments 52 and/or 54 thereto.

One or more of the prefabricated wall segments 52, 54 may also include other features that further enhance the modularity and flexibility of the exemplary attenuation structure design. For example, as shown in the illustrated embodiment, the prefabricated inner wall segment 52 may include a plurality of radio frequency (RF) absorbing cones 58, which may further enhance the electromagnetic attenuation characteristics of the overall attenuation structure. Other such features that may be provided with the prefabricated wall segment(s) include, but are not limited to dielectric foams, cavity resonance absorbers, broadband foam absorbers, and the like. It is further understood that such prefabricated wall segments and corresponding features may be provided internal or external to the additively manufactured concrete portions of the attenuation structure, and may be applied to additively manufactured concrete wall segments of any shape or configuration.

Turning to FIG. 5, another feature of an exemplary attenuation structure is shown in the form of a non-concrete material 60 interposed between a first concrete material 62 having a first attenuation dopant, and a second concrete material 64 having a second attenuation dopant. In this example, the second attenuation dopant may be different from the first attenuation dopant, whereby the first and second concrete materials 62 may have different attenuation characteristics. The first concrete material 62 and the second concrete material 64 may each be configured to attenuate radiation differently based on their respective positions within the attenuation structure and/or based on their positions relative to each other and/or relative to the non-concrete material 60.

For example, the first concrete material 62 and/or the second concrete material 64 may enhance the properties of constructive or destructive interference of the incident radiation. In this manner, the respective concrete materials 62, 64 may be configured to cooperate with each other to provide a "metamaterial-like" effect in which each of the concrete materials 62, 64 have features (e.g., dopant(s) or structural features) that are arranged at wavelengths smaller than the wavelengths of the radiation phenomena intended to be influenced (e.g., quarter-wave, half-wave, etc.). The precise shape, geometry, size, orientation and arrangement of the concrete materials 62, 64 with respect to each other (including the respective configurations of the dopant(s) dispersed therein) may provide properties capable of manipulating the incident radiation by reflecting, absorbing, enhancing, bending, etc. the incident radiation waves to achieve benefits that go beyond what is possible with conventional bulk materials. For example, the respective concrete materials 62, 64 may be configured to "artificially" enhance reflectance or absorption through a constructive or destructive interference process in which a series of transmissions and reflections of the incident radiation are provided by each layer (or wall) of concrete material. Alternatively or additionally, the metamaterial-like effect may be provided by gradient layer(s) within each concrete material, or even gradient layer(s) within a single concrete material. In addition, the different concrete materials 62, 64 (or different gradients within each concrete material) may be configured to attenuate different portions of the frequency spectrum of the incident radiation by providing different types or configurations of the dopant(s) dispersed therein. It is understood that such configurations of the first concrete material 62 with respect to the second concrete material 64 may be provided with or without the non-concrete material 60 interposed therebetween.

In exemplary embodiments, the non-concrete material 60 may include a dielectric material, which may be configured to attenuate an electromagnetic wave via absorption by increasing the loss factor (i.e., dielectric constant or κ-factor) of the dielectric material and/or by increasing the path length of the electromagnetic wave through the dielectric material. Alternatively, the non-concrete material may provide thermal insulative properties, acoustic attenuation properties, or other desirable properties to enhance the design flexibility and usability of the exemplary attenuation structure, as understood by those having skill in the art.

In addition, as shown in the illustrated embodiment of FIG. 5, the additive manufacturing apparatus may include multiple extrusion heads 70, 72, 74 for simultaneously depositing each of the non-concrete material 60, the first concrete material 62, and the second concrete material 64. By providing multiple extrusion heads, the speed to manufacture the attenuation structure may be increased. In addition, the simultaneous deposition of the materials adjacent to each other may enable improved tolerances between the dissimilar materials when deposited, and may enable the dissimilar materials to better bind together when curing. It is understood that although the extrusion heads 70, 72, and 74 are shown as being integral with each other, the extrusion heads 70, 72, and 74 may also be separate and independently controllable so as to enable movement in different directions with respect to each other. It is further understood that although the extrusion heads 70, 72, 74 are shown as depositing both concrete materials 62, 64 and non-concrete materials 60, the multiple extrusion heads could also deposit the same concrete materials or the same non-concrete materials simultaneously, or could deposit various types of only concrete materials simultaneously, or could deposit various types of only non-concrete materials simultaneously, etc.

Referring to FIG. 6, another exemplary method of additively manufacturing an attenuation structure is shown with another exemplary extrusion head 80. The extrusion head 80 includes at least two input ports 82, 84 which respectively receive materials 83, 85. One or more of the materials 83, 85 may be concrete materials having attenuation dopants dispersed therein according to the methods described above, or one or more of the materials 83, 85 may be non-concrete materials, such as dielectric materials, as described above. The materials 83, 85 may be fed to the input ports 82, 84 by suitable conduits, actuators, pumps, and the like. The extrusion head 80 also includes a chamber 86 in which the respective materials 83, 85 may be combined. The materials 83, 85 may be combined in the chamber 86 in such a way that they are coextruded through a nozzle 88 as a heterogeneous mixture (e.g., a heterogeneous concrete material). For example, as shown in FIG. 7, the heterogeneous mixture may include both materials 83, 85 within a single extrusion layer 89 which is deposited during the additive manufacturing process and thereafter cured to provide the desired attenuation effect of the attenuation structure. Alternatively or additionally, the materials 83, 85 may be extruded in an alternating consecutive pattern as they exit the nozzle 88. Optionally, the materials 83, 85 may also be mixed, such as within the extrusion head 80, to provide a more homogeneous deposited material, or may be provided in any other desired configuration as they exit the nozzle 88. As discussed above, such mixing and/or combination of the respective materials 83, 85 close to the point of extrusion at the nozzle 88 may enable improved control over the desired attenuation characteristics of the deposited material by reducing dead volume as the materials are mixed and/or combined.

Figure 8:
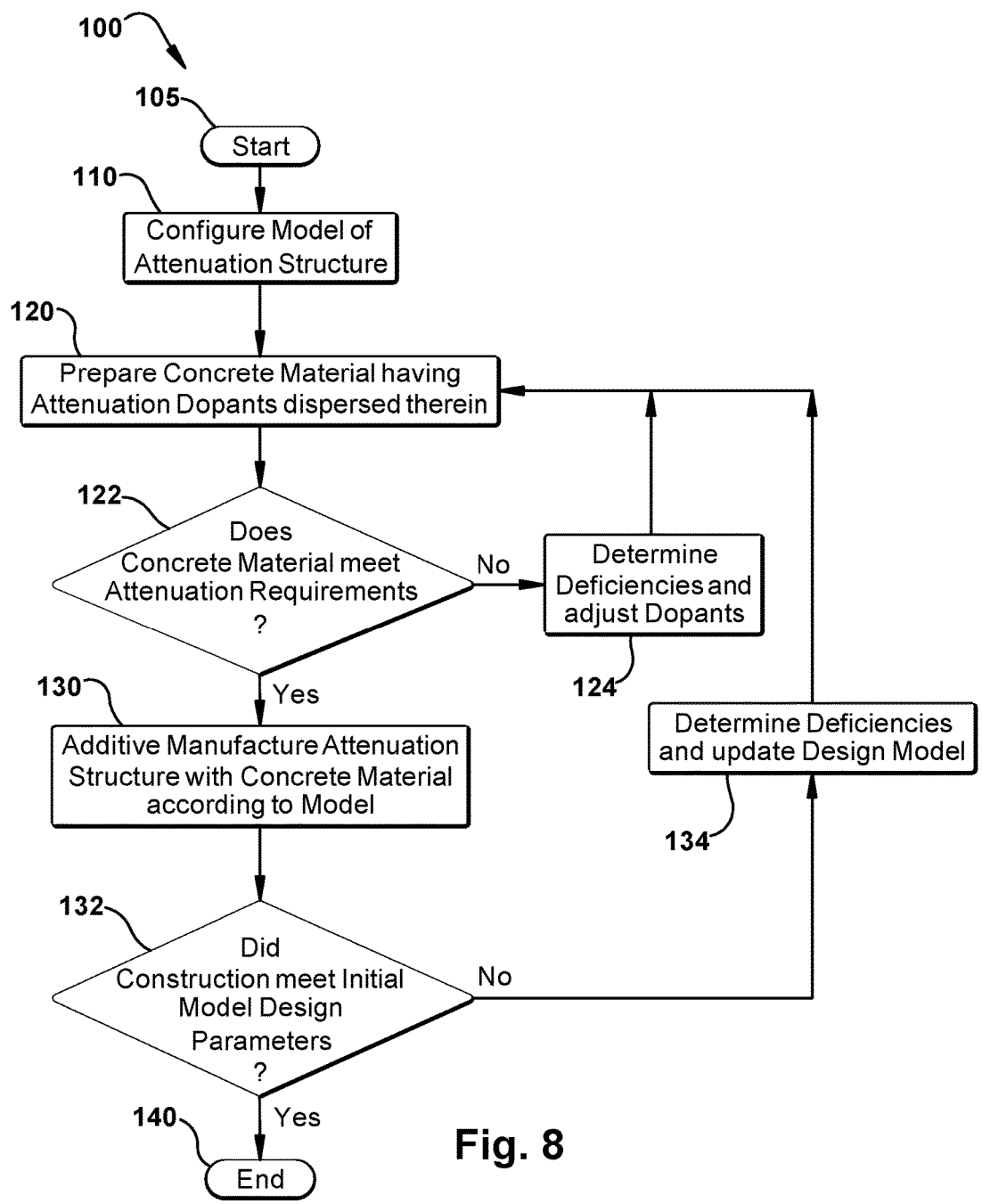
FIG. 8 is a flow chart illustrating an exemplary additive manufacturing process for forming an exemplary attenuation structure.

Referring to FIG. 8, a flow chart shows an exemplary process 100 of additively manufacturing the exemplary attenuation structure as hereinbefore described. As shown, the process 100 begins at step 105, and may be carried out using suitable digital electronic circuitry, or computer software, firmware, or hardware, as understood by those having skill in the art. At step 110 a model is configured for additively manufacturing the attenuation structure as hereinbefore described. At step 120 one or more concrete materials having attenuation dopants dispersed therein are prepared as hereinbefore described. Optionally, at step 122 the one or more concrete materials may be measured to determine if the deposited concrete material(s) will meet the desired attenuation characteristics according to the model. For example, a sensor, such as a probe, may be in contact with and measure the one or more concrete materials during the additive manufacturing process, such as during or after the mixing and before the deposition thereof. If it is determined at step 122 that the concrete material(s) do not meet (or will not meet when deposited) the desired attenuation characteristics, then at step 124 the deficiencies may be determined and the dopant(s) may be adjusted to correct these deficiencies (such as through the use of a controller with a feedback loop, as shown). If it is determined at step 122 that the concrete material(s) will meet the desired attenuation characteristics, then the process proceeds to step 130.

At step 130 the attenuation structure is additively manufactured with the one or more concrete materials to form the attenuation structure according to the model as hereinbefore described. Optionally, at step 132 the construction of the attenuation structure may be tested to determine if the attenuation structure meets the initial model design parameters. This testing may be accomplished after the building of the attenuation structure has been completed, or the testing may be accomplished in build phases, or the testing may be accomplished in situ during the deposition of the concrete material(s). If it is determined at step 132 that the built (or being built) attenuation structure does not meet (or will not meet) the design parameters according to the model, then at step 134 the deficiencies may be determined and the design model may be adjusted to correct these deficiencies (such as through the use of a controller with a feedback loop, as shown). If it is determined at step 132 that the attenuation structure will meet the design parameters according to the model, then the process ends at step 140.

A radiation-shielding attenuation structure 10 and method of forming the attenuation structure 10 have been disclosed herein. The attenuation structure 10 is made by additively manufacturing a concrete material 12 that includes at least one attenuation dopant. The one or more attenuation dopants may be configured in the concrete material 12 to attenuate one or more types of radiation, such as electromagnetic radiation, gamma radiation, X-ray radiation, or neutron radiation, which enhances the radiation shielding functionality of the concrete material 12. The attenuation structure 10 formed by the concrete material 12 may be additively manufactured on-site according to a model that has already been pre-certified for safe or secure use, thereby providing a repeatable and reproducible process that can reduce lead times and fabrication costs. The attenuation structure 10 may be easily modified during the additive manufacturing process to have different concrete mixtures with different attenuation characteristics, which increases the tailorability and flexibility in design of the attenuation structure 10.

It is understood that embodiments of the subject matter described in this specification can be implemented in combination with digital electronic circuitry, or computer software, firmware, or hardware. Embodiments of the subject matter described in this specification can be implemented in an additive manufacturing system that uses one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "controller" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

An "operable connection," or a connection by which entities are "operably connected," is one in which signals, physical communications, or logical communications may be sent or received. Typically, an operable connection includes a physical interface, an electrical interface, or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical or physical communication channels can be used to create an operable connection.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

Processors encompass all apparatus, devices, and machines suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented using a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented using a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming an electromagnetic radiation shielding attenuation enclosure for containing electronic equipment having sensitive information, the method comprising:

configuring an additive manufacturing model of the electromagnetic radiation shielding attenuation enclosure; and additively manufacturing the electromagnetic radiation shielding attenuation enclosure according to the model;

wherein the additively manufacturing includes depositing a concrete material that includes a prescribed amount of an electromagnetic radiation attenuation dopant dispersed within the concrete material for enhancing the electromagnetic radiation shielding of the concrete material, the prescribed amount of electromagnetic radiation attenuation dopant configured to effect an increase in the attenuation of radio frequency waves impinging the concrete material, thereby restricting access from outside of the enclosure to the sensitive information of the electronic equipment contained within the enclosure;

wherein the additive manufacturing model specifies continuously varying concentrations of the electromagnetic radiation attenuation dopant at different portions of the electromagnetic radiation shielding attenuation enclosure to provide a gradient radio frequency attenuation characteristic of the attenuation enclosure at the different portions; and wherein the additive manufacturing includes depositing individual layers of the concrete material along continuous predetermined layer paths according to the model, and during the depositing of each of at least some of the layers, the concentration of the electromagnetic attenuation dopant is continuously varied along at least a portion of the layer path in accordance with the model to provide the gradient radio frequency attenuation characteristic of the attenuation enclosure.

2. The method according to claim 1,
wherein the depositing the concrete material includes extrusion of a curable concrete slurry, and
wherein the electromagnetic radiation attenuation dopant is heterogeneously dispersed in the concrete material being deposited.

3. The method according to claim 2, further comprising:
feeding the concrete material from a source to an extrusion nozzle; and
dispersing the electromagnetic radiation attenuation dopant into the concrete material downstream of the source and upstream of the extrusion nozzle.

4. The method according to claim 1, wherein the electromagnetic radiation attenuation dopant is configured to effect an increase in the attenuation of the radio frequency waves impinging the concrete material via absorption.

5. The method according to claim 4, wherein the electromagnetic radiation attenuation dopant is configured to effect an increase in the attenuation of the radio frequency waves impinging the concrete material via reflection, the electromagnetic radiation attenuation dopant being a conductive material including steel, carbon, taconite, and/or nickel.

6. The method according to claim 1, wherein the concrete material includes a second attenuation dopant configured to attenuate neutron radiation.

7. The method according to claim 6, wherein the second attenuation dopant is a high neutron capture cross section material including boron, cadmium, and/or gadolinium.

8. The method according to claim 1, wherein the concrete material includes a second attenuation dopant configured to attenuate gamma radiation or X-ray radiation.

9. The method according to claim 8, wherein the second attenuation dopant is a high atomic number material including lead, tungsten, and/or tantalum.

10. The method according to claim 1,
wherein the electromagnetic radiation attenuation dopant is a first attenuation dopant; and
wherein the concrete material includes a second attenuation dopant different from the first attenuation dopant, the first and second attenuation dopants having different attenuation characteristics.

11. The method according to claim 10, wherein the second attenuation dopant is a high neutron capture cross section material configured to attenuate neutron radiation, or
wherein the second attenuation dopant is a high atomic number material configured to attenuate gamma radiation or X-ray radiation.

12. The method according to claim 1, wherein the additively manufacturing includes depositing a non-concrete material.

13. The method according to claim 12, wherein the non-concrete material is a dielectric material.

14. The method according to claim 1, wherein the additively manufacturing includes deposition with a plurality of extrusion heads;
wherein at least one of the plurality of extrusion heads deposits the concrete material having the electromagnetic radiation attenuation dopant; and
wherein at least one of the plurality of extrusion heads deposits a second concrete material that includes a second attenuation dopant, the second concrete material having a second attenuation characteristic different from the attenuation characteristic provided by the electromagnetic radiation attenuation dopant.

15. The method according to claim 1, wherein the additively manufacturing includes deposition with a plurality of extrusion heads;
wherein at least one of the plurality of extrusion heads deposits the concrete material having the electromagnetic radiation attenuation dopant; and
wherein at least one of the plurality of extrusion heads deposits a non-concrete material.

16. The method according to claim 1, wherein the additively manufacturing includes free forming one or more structural electromagnetic radiation attenuation features configured to further enhance attenuation of radio frequency waves impinging the attenuation enclosure.

17. The method according to claim 1, wherein the additively manufacturing includes building the attenuation enclosure as a standalone unitary structure having free-formed, continuous walls configured to minimize the number of penetrations, thereby reducing leakage of radio frequency waves containing sensitive information out of the enclosure.

18. The method according to claim 1,
wherein the electromagnetic radiation attenuation dopant is configured to effect an increase in the attenuation of the radio frequency waves impinging the concrete material via absorption; and
the method further comprising a step of applying a non-concrete material adjacent to the concrete material, such that the concrete material and the non-concrete material cooperate with each other to further increase attenuation of radio frequency waves impinging the attenuation enclosure.

19. The method according to claim 1, wherein the configuring the additive manufacturing model includes determining the prescribed amount of electromagnetic attenuation dopant dispersed within the concrete material, and wherein the additive manufacturing model is pre-certified for providing an electromagnetic radiation shielding enclosure that protects sensitive electronic communications according to industry and/or military standards, the method further comprising:
testing the electromagnetic radiation shielding enclosure after completing the manufacturing thereof to ensure conformance to the industry and/or military standards.

* * * * *